(12) United States Patent
Li (10) Patent No.: US 6,403,926 B2
(45) Date of Patent: Jun. 11, 2002

(54) THERMAL PROCESSING APPARATUS HAVING A COOLANT PASSAGE

(75) Inventor: Yicheng Li, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/849,348

(22) Filed: May 7, 2001

(30) Foreign Application Priority Data

May 8, 2000 (JP) ........................................ 2000-134967

(51) Int. Cl.[7] .................................................. F27B 5/14
(52) U.S. Cl. ........................ 219/390; 219/405; 219/411; 118/724; 118/50.1; 392/416
(58) Field of Search ................. 219/390, 405, 219/411; 118/724, 725, 50.1; 392/416, 418

(56) References Cited

U.S. PATENT DOCUMENTS 5,960,158 A * 9/1999 Gat et al. ................... 392/416
6,172,337 B1 * 1/2001 Johnsgard et al. .......... 219/390

* cited by examiner

*Primary Examiner*—Teresa Walberg
*Assistant Examiner*—Shawntina Fuqua
(74) *Attorney, Agent, or Firm*—Pillsbury Winthrop LLP (57) ABSTRACT

A thermal processing apparatus includes a cooling water passage in a circumferential wall of a processing vessel such that the cooling water passage extends from a water inlet port to a turn-around point along the circumferential wall in a first direction and further from the turn-around point to a water exit port in a second, opposite direction.

14 Claims, 8 Drawing Sheets

THERMAL PROCESSING APPARATUS HAVING A COOLANT PASSAGE

CROSS-REFERENCE TO RELATED APPLICATIONS

The present application is based on Japanese priority application No.2000-134967 filed on May 8, 2000, the entire contents of which are hereby incorporated by reference.

BACKGROUND OF THE INVENTION

The present invention generally relates to fabrication of semiconductor devices and more particularly to a thermal processing apparatus and method used in a fabrication process of a semiconductor device.

A single-wafer thermal processing apparatus is an apparatus used for fabricating a semiconductor device on a semiconductor wafer. A single-wafer thermal processing apparatus applies a thermal processing to semiconductor wafers one by one. Particularly, there is a type of single-wafer thermal processing apparatus that uses a lamp as a heat source. The apparatus of this type is important as it is used extensively in various annealing processes, oxidation processes, CVD processes, and the like.

Figure 8:
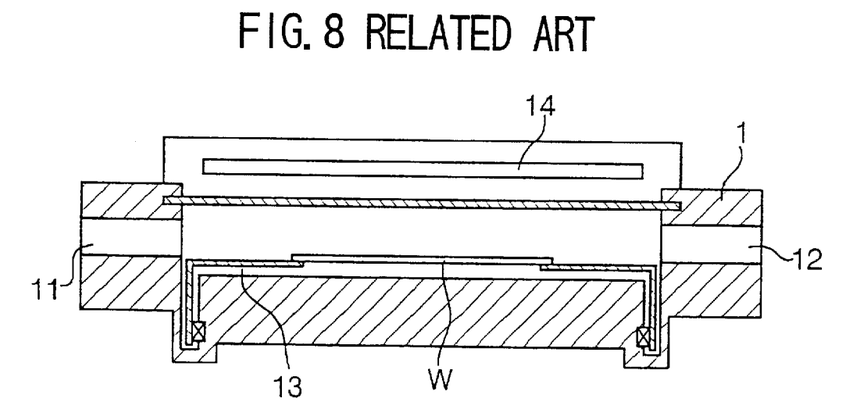
FIG. 8 is a diagram showing the construction of a conventional single-wafer thermal processing apparatus in an elevational cross-sectional view.
Figure 9:
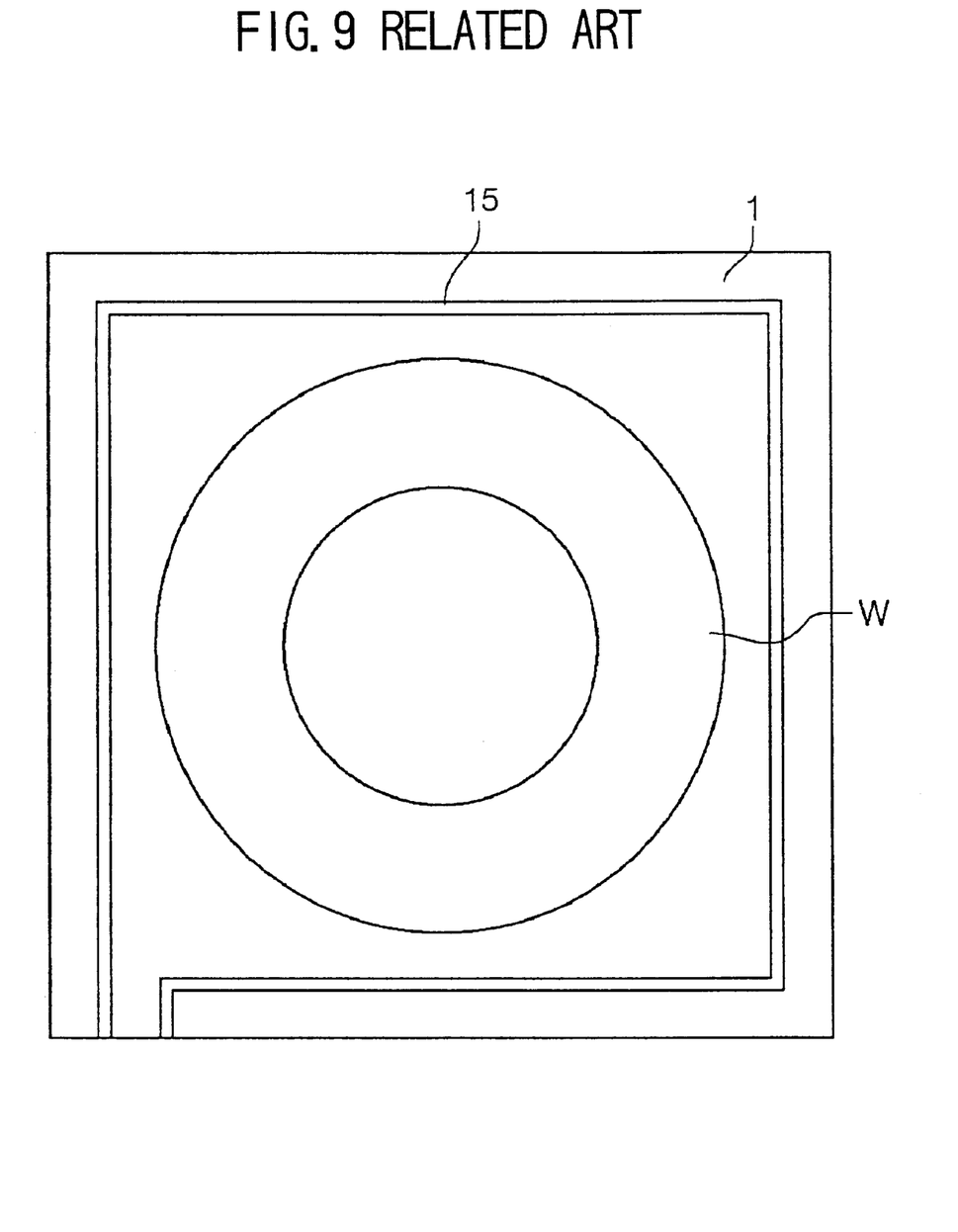
FIG. 9 is a diagram showing the construction of a cooling water passage formed in a processing vessel of the conventional thermal processing apparatus.

FIGS. 8 and 9 show the construction of a conventional thermal processing apparatus.

Referring to FIGS. 8 and 9, the thermal processing apparatus includes a processing vessel 1 accommodating therein a semiconductor wafer to be processed, wherein the processing vessel 1 includes a laterally elongated gas inlet and a laterally elongated gas outlet on respective, mutually opposing sidewalls with a height of about 15 mm. The processing vessel 1 further includes a support ring 13 at a bottom part thereof for holding the semiconductor wafer, wherein the support ring 13 is provided rotatable and is driven via a magnetic coupling not illustrated in response to an external magnetic energization.

The processing vessel 1 further includes a lamp 14 at the ceiling part as a heat source heating the semiconductor wafer on the support ring 13, and there is provided a cooling water passage 15 in the sidewall of the reaction vessel 1 such that the cooling water passage 15 extends in a circumferential direction of the reaction vessel 1. By causing to flow cooling water through the cooling water passage 15, the sidewall of the reaction vessel 15 is cooled.

In such a single-wafer thermal processing apparatus, there is a requirement that the temperature distribution in the wafer should be uniform during the thermal processing conducted therein, wherein the required degree of temperature uniformity is increasing in recent semiconductor devices formed on a wafer with an increased degree of device miniaturization.

From the viewpoint of the increased degree of uniformity of temperature distribution required for the thermal processing apparatus, the conventional thermal processing apparatus of FIGS. 8 and 9 is not satisfactory as the cooling water experiences a temperature rise as it is caused to flow from the cooling water inlet to the cooling water outlet along the cooling water passage 15. Thus, there can be a case in which the temperature of the cooling water 15 is much higher at the cooling water outlet as compared with the temperature at the cooling water inlet, and there is formed a circumferential temperature distribution profile along the sidewall of the processing chamber 1. In such a case, there appears a temperature difference between the left-half part of the sidewall close to the cooling water inlet and right-half part of the sidewall close to the cooling outlet in the plan view of FIG. 9.

In the processing vessel 1, it should be noted that there is formed a gas flow from one sidewall where the gas inlet 11 is provided to an opposing sidewall where the gas outlet 12 is provided. In an ordinary pressure process in particular, as in the case of conducting an annealing process while supplying an inert gas to the wafer under the ordinary pressure, there appears a velocity distribution in the gas flow supplied from the laterally elongated gas inlet 11 such that the gas velocity is large at the central part and small at the lateral edge part of the sheet-like gas flow.

From above, it will be understood that the conventional thermal processing apparatus has a problem of difficulty in achieving a uniform temperature distribution over the entire surface of the wafer W processed therein. In order to minimize the foregoing problem, the conventional thermal processing apparatus has adopted a rotating mechanism rotating the wafer W with respect to the lamp 14. While such a construction may be effective when the wafer W is rotated at a high speed, rotation of the wafer at a high speed causes a problem such as particle generation. Thus, there is a limitation in such an approach.

SUMMARY OF THE INVENTION

Accordingly, it is a general object of the present invention to provide a novel and useful thermal processing apparatus wherein the foregoing problems are eliminated.

Another and more specific object of the present invention is to provide a thermal processing apparatus that realizes a uniform environment with respect to a substrate processed therein in a circumferential direction thereof.

Another object of the present invention is to provide a thermal processing apparatus comprising:

a processing vessel accommodating therein a stage, said stage being adapted for holding a substrate to be processed;

an evacuation system connected to said processing vessel;

a heater disposed so as to heat said substrate on said stage;

a gas inlet port provided on said processing vessel for introducing a gas into said processing vessel; and a coolant passage provided in a circumferential wall of said processing vessel, said coolant passage comprising: a first part connected to an inlet port of said coolant and extending along said circumferential wall of said processing vessel to a turn-around point, and a second part connected to said turn-around point and extending along said circumferential wall in a reverse direction to said first part to an outlet port of said coolant.

Another object of the present invention is to provide a thermal processing method of a substrate comprising the steps of:

placing a substrate on a stage provided in a processing vessel; and heating said substrate while supplying a gas in said processing vessel, said step of heating being conducted while causing to flow a coolant through a circumferential wall of said processing vessel first in a first direction from a coolant inlet port to a turn-around point and then in a second, opposite direction from said turn-around point to a coolant outlet port.

According to the present invention, the temperature profile in the coolant, which may be a cooling water, flowing through the first part of the cooling medium passage is compensated by the temperature profile in the second part, and a highly uniform temperature distribution is achieved in the circumferential wall of the processing chamber. Thereby, a uniform thermal processing becomes possible in the processing chamber. In view of reduced temperature difference caused in the coolant in the second part of the passage, it is desirable to provide the second part in the circumferential wall at a location closer to the substrate.

Another object of the present invention is to provide a thermal processing apparatus, comprising:

a processing vessel accommodating therein a stage, said stage being adapted for holding a substrate to be processed;

an evacuation system evacuating to said processing chamber;

a heater disposed so as to heat said substrate on said stage;

said processing vessel having an opening and a depression in a circumferential wall thereof such that said opening and said depression oppose with each other with respect to a central axis of said processing vessel, said opening being connected to a gate valve;

said processing vessel further having a gas inlet port and an evacuation port on said circumferential wall such that said gas inlet and said evacuation port oppose with each other with respect to said central axis of said processing vessel, said evacuation system being connected to said evacuation port, said gas inlet port being located at an angular position offset from said opening by 90° with respect to a central axis of said processing chamber.

According to the present invention, a uniform distribution is achieved for the thermal radiation and thermal conduction from the vessel circumferential wall to the substrate along the circumferential direction of the processing vessel. Thus, a highly uniform temperature distribution is achieved in the substrate during the thermal processing process conducted in the processing vessel.

It is preferable to provide an observation window in the depression. Further, it is preferable to provide the gas inlet in the form of laterally elongated slit having a height of 0.5–2 mm. By doing so, uniform supplying of the processing gas to the substrate becomes possible.

Other objects and further features of the present invention will become apparent from the following detailed description when read in conjunction with the attached drawings.

DETAILED DESCRIPTION OF THE PREFERRED EMBODIMENTS

Figure 1:
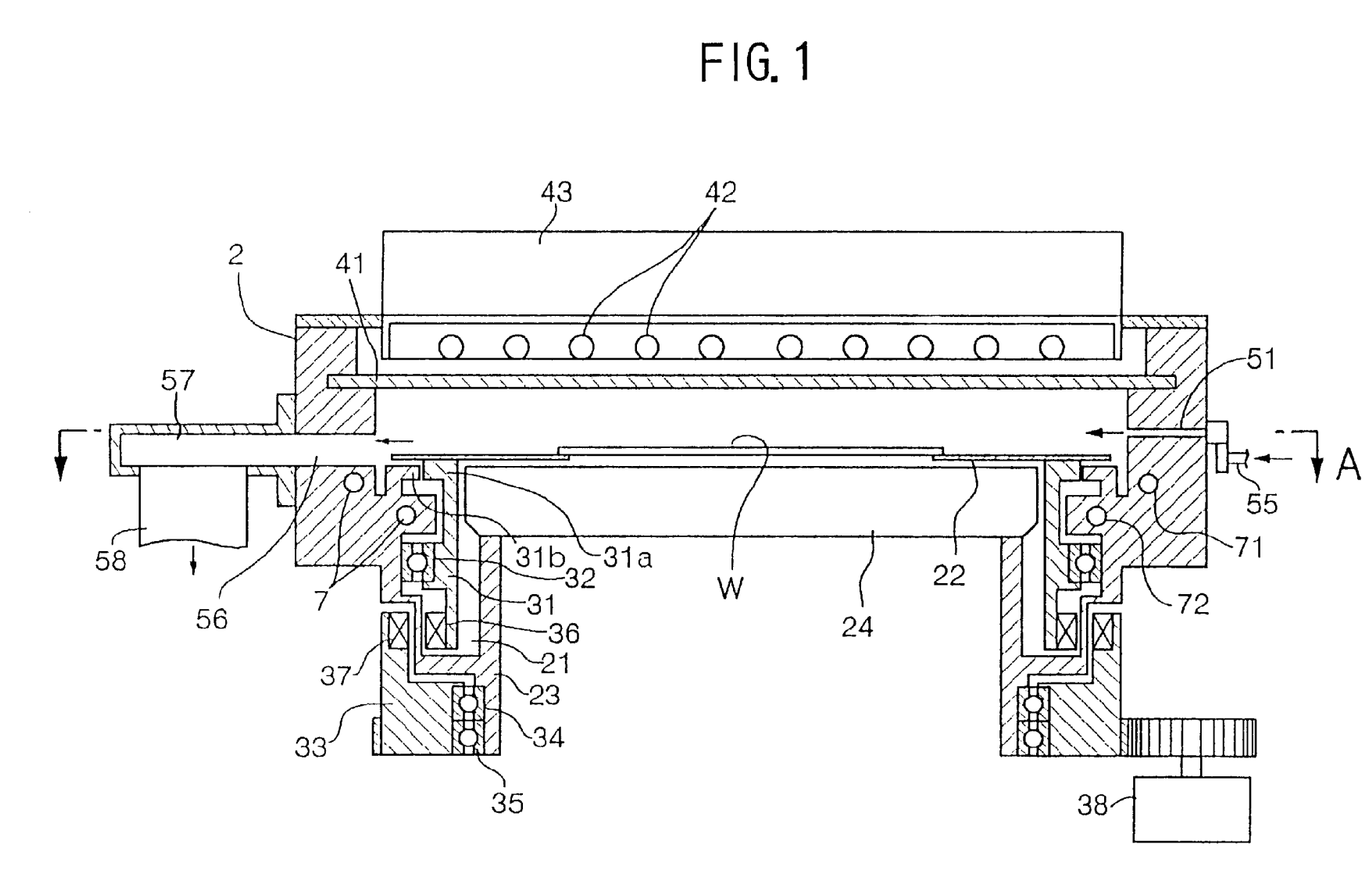
FIG. 1 is a diagram showing the construction of a thermal processing apparatus according to an embodiment of the present invention in a cross-sectional view taken along a first cross-section.
Figure 2:
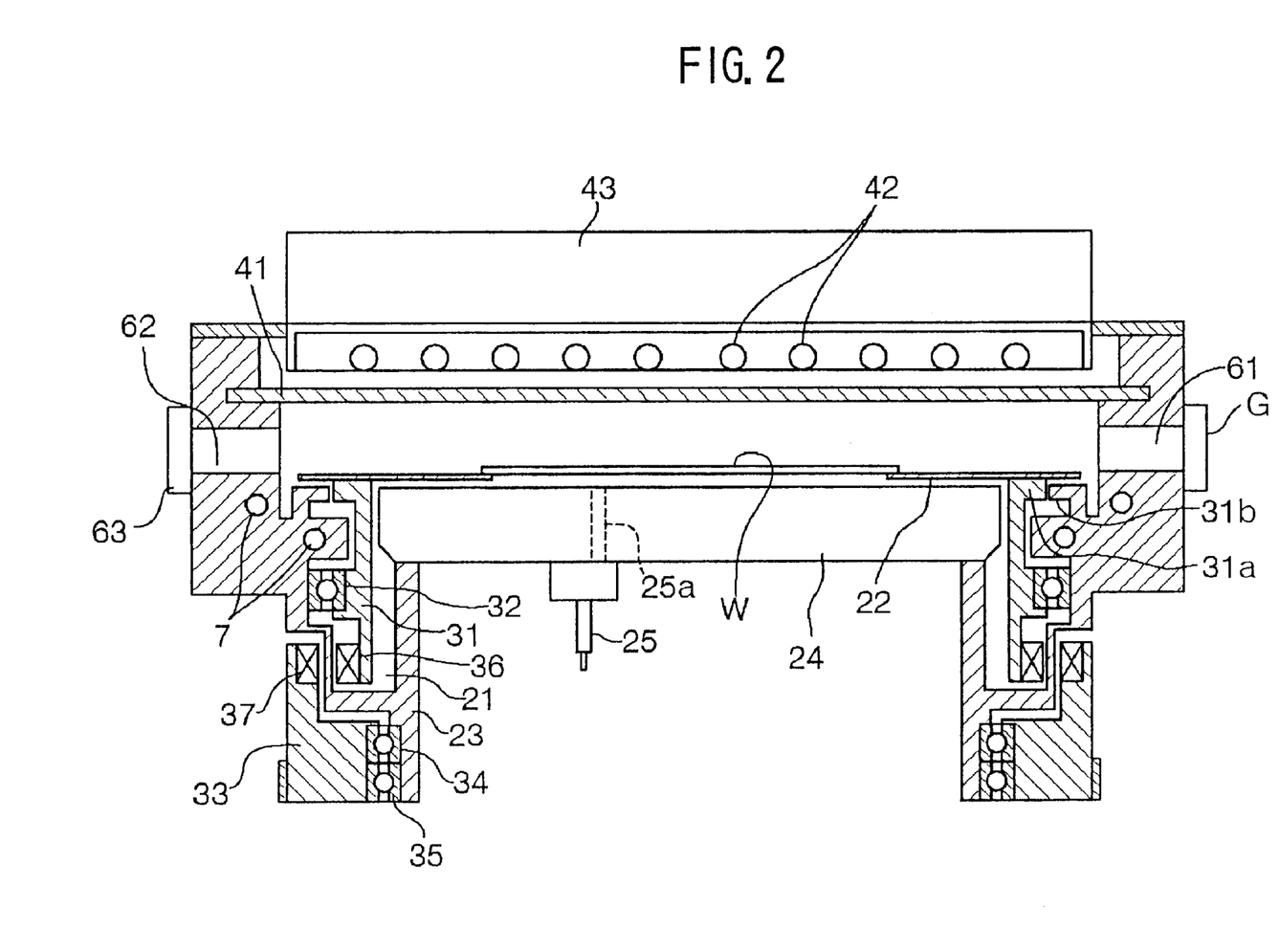
FIG. 2 is a diagram showing the construction of the thermal processing apparatus of FIG. 1 in a cross-sectional view taken along a second cross-section offset from the first cross-section by 90°.

FIGS. 1 and 2 show the construction of a thermal processing apparatus according to a first embodiment of the present invention, wherein FIG. 1 shows the thermal processing apparatus in a vertical cross-sectional view taken along a first vertical cross-section while FIG. 2 shows the same thermal processing apparatus in a second vertical cross-sectional view taken along a second vertical cross-section crossing the first cross-section by an angle of 90°.

Referring to the drawings, the thermal processing apparatus includes a flat processing vessel 2 made of aluminum (A5052), wherein the processing vessel has a generally circular form in a plan view.

At the bottom part of the processing vessel 2, there is provided a ring-shaped groove 21 along an inner rim of the vessel 2, and the ring-shaped groove 21 accommodates therein a rotary sleeve 31. In the groove 21, the rotary sleeve 31 is held rotatable by a bearing mechanism 32, and the rotary sleeve 31 is formed with a support-ring part 31a on a top part thereof as an outwardly extending part of the sleeve 31.

The support-ring part 31a, in turn, carries thereon a ring-shaped stage 22 for holding thereon a wafer W, wherein the stage 22 engages a rim part of the wafer W and is rotated together with the rotation of the rotary sleeve 31 about a vertical axis at the center of the processing vessel 2. Further, the processing vessel 2 includes a light-shielding ring 31b on a circumferential wall thereof in correspondence to the support-ring part 31a such that the light-shielding ring 31b extends toward the support-ring part 31a. The stage 22, the support ring part 31a and the light shielding ring 31b form together a symmetric structure about the central axis of the processing vessel 2.

It should be noted that the processing vessel 2 further includes a housing 23 defining an inner wall of the groove 21 as an extension of the circumferential wall in a downward direction, wherein the housing 23 carries, on an outer surface thereof, an outer rotary body 33 via bearing mechanisms 34 and 35 formed adjacent with each other. Thereby, the outer rotary body 33 is mounted on the housing 23 so as to rotate freely about the central axis of the processing vessel 2.

As represented in FIG. 1, the rotatable sleeve 31 carries a magnet 36 on an outer surface thereof, while the rotary body 33 carries a magnet 37 on an inner surface thereof in magnetic coupling with the magnet 36. Thus, the inner sleeve 31, and hence the stage 22 connected thereto, is rotated in response to rotation of the outer rotary body 33 caused by a stepping motor 38 due to the foregoing magnetic coupling between the magnets.

It should be noted that the processing vessel 2 includes a bottom plate 24 at the top part of the ring-shaped groove 21 so as to close the bottom part of the processing vessel 2, wherein the bottom plate includes a radiation pyrometer 25 (see FIG. 2) that measures the temperature of the wafer W based on detection of infrared radiation emitted from the bottom surface of the wafer W. Further, the bottom plate 24 carries thereon lifter pins for lifting up the wafer W such that the wafer W can be transferred from an external transportation arm to the stage 22 or from the stage 22 to the external transportation arm. The interior surface of the processing vessel 2 is finished by a mechanical chemical polishing (OMCP) process and forms a mirror having a reflectance of 93% or more with regard to infrared radiation.

At the ceiling part of the processing vessel 2, there is provided a transparent window 41 and a heat source 42, typically a ring-shaped halogen lamp, is provided outside the transparent window 41. Further, there is provided a housing 43 above the lamp 42 wherein the housing 43 accommodates therein a driving system of the lamp 42.

Figure 3:
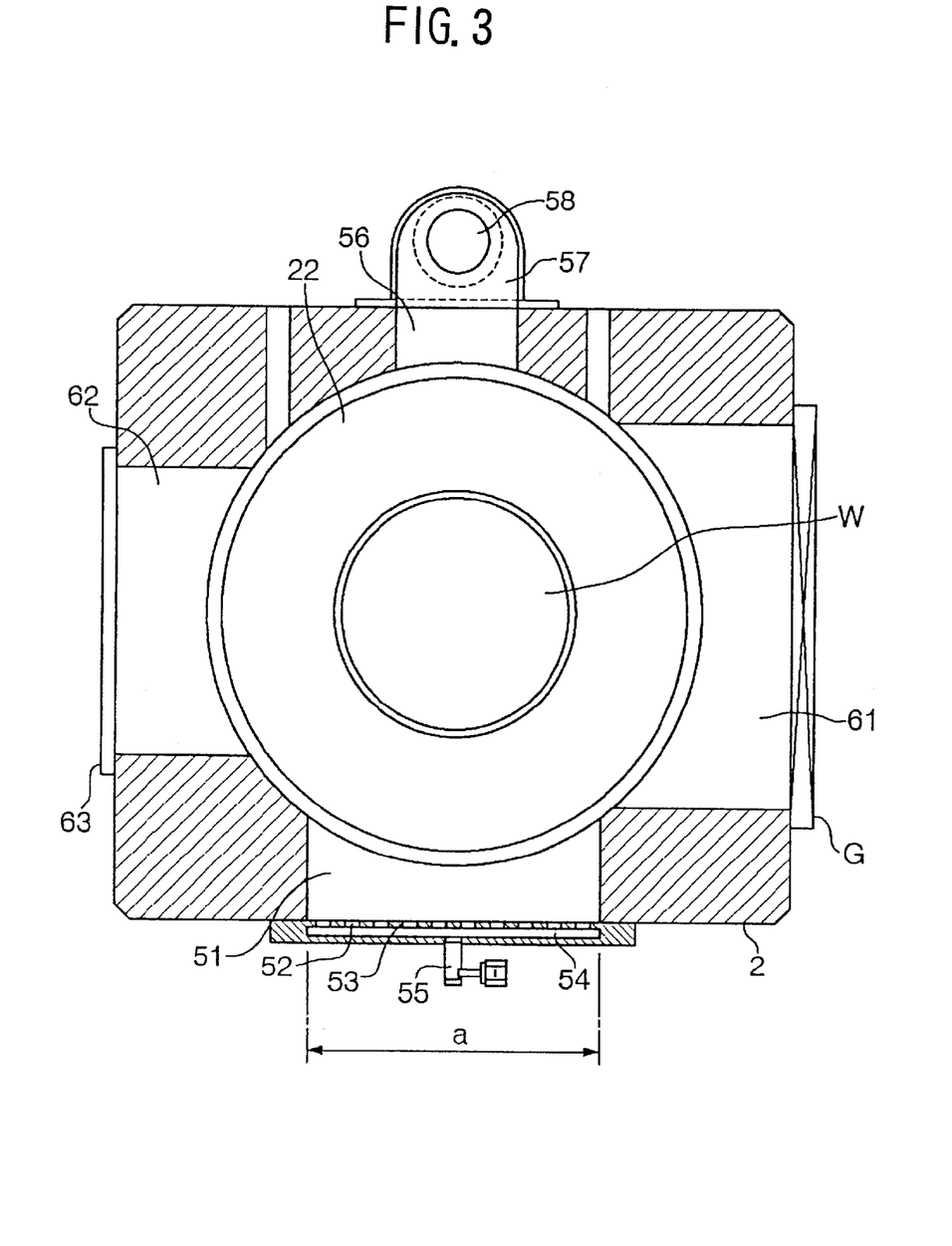
FIG. 3 is a transverse cross sectional view of the thermal processing apparatus of FIG. 1 taken along a line A—A thereof.

FIG. 1 and FIG. 3 show a slit-like, laterally elongated gas inlet port 51 formed on the circumferential wall of the processing vessel 2 for introducing a processing gas into the vessel 2, wherein the gas inlet port 51 has a height of about 2 mm and a lateral size a set slightly larger than a diameter of the wafer W.

Figure 4:
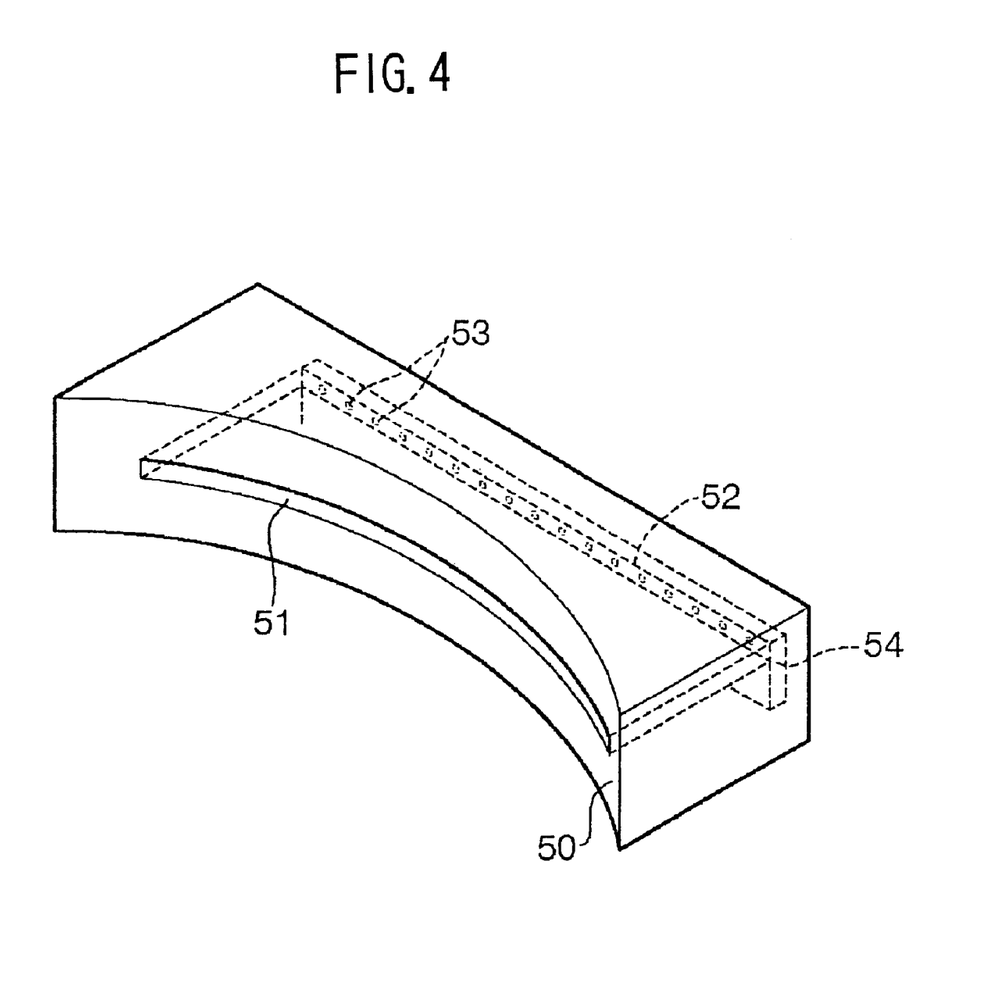
FIG. 4 is a diagram showing the construction of a gas inlet port used in the thermal processing apparatus of FIG. 1.
Figure 5:
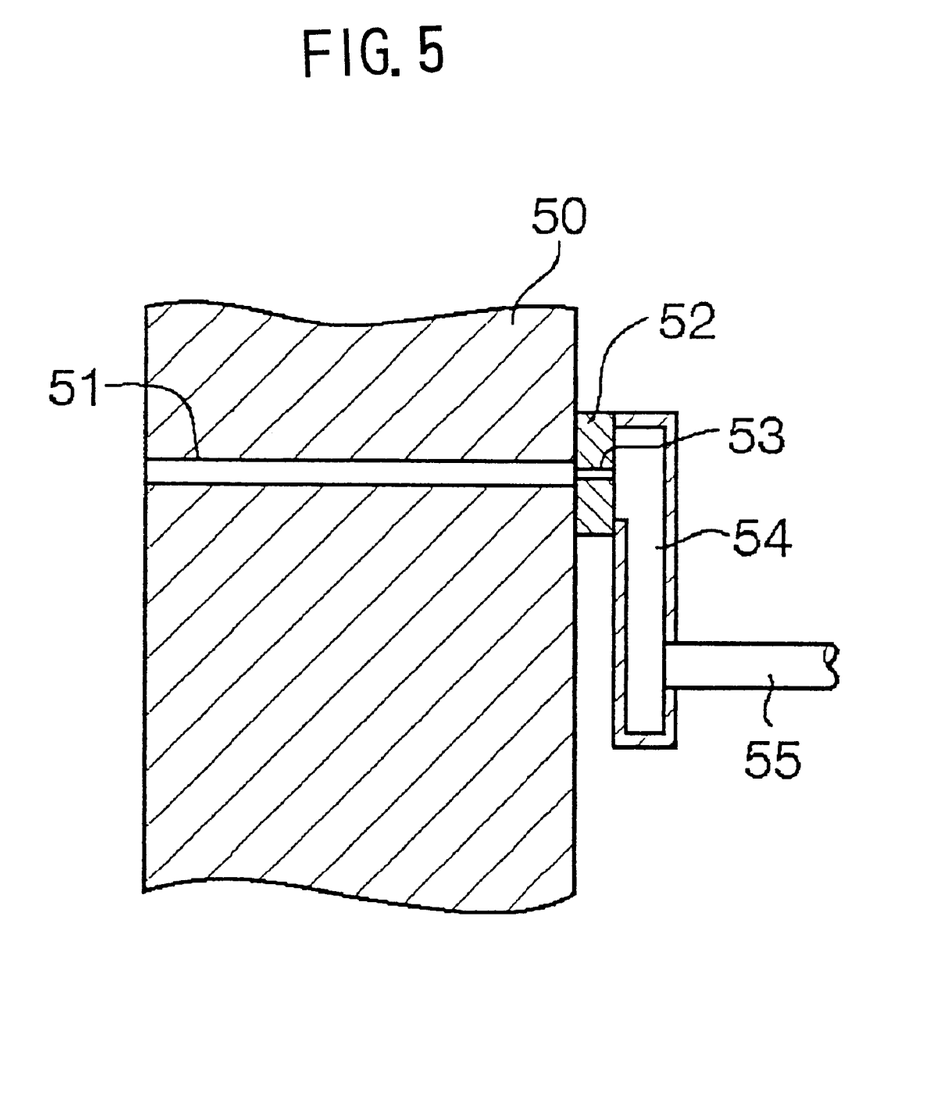
FIG. 5 is another diagram showing the construction of the gas inlet port used in the thermal processing apparatus of FIG. 1.

FIGS. 3–5 show the part related to the gas inlet port 51.

Referring to the drawings, particularly FIG. 4, it can be seen that there is provided a compartment wall 52 in the upstream side of the gas inlet port 51 so as to close the gas inlet port 51, wherein the compartment well 52 is provided with a number of minute holes 53 aligned in the elongating direction of the gas inlet port 51. The minute holes 53 have a diameter of about 1 mm and serve as the passage of the gas. In FIGS. 4 and 5, it should be noted that the part 50 corresponds to the circumferential wall of the processing vessel 2.

Behind the compartment wall 52, there is provided a buffer chamber 54, wherein the buffer chamber 54 is provided such that a bottom edge of the buffer chamber 54 is located at a position offset from the minute holes 53. Further, a gas supply line 55 is connected to the buffer chamber 54 at the position close to the bottom edge of the buffer chamber 54 so as to avoid direct injection of the gas into some of the holes 53 from the gas supply line 55.

At the left side of the circumferential wall of the processing vessel 2 represented in FIG. 1, there is provided an evacuation port 56 for evacuating the processing vessel 2 at a location opposing the gas inlet port 51, wherein the evacuation port 56 is connected to an evacuation line 58 via a buffer chamber 57 that is provided outside the processing vessel 2 in correspondence to the evacuation port 56.

Further, the processing vessel 2 is formed with a wafer-transport opening 61 at the right side part and a depression 62 at the left side part in the representation of FIG. 2 such that the wafer-transport opening 61 and the depression 62 oppose with each other with regard to the central axis of the processing vessel 2. In the illustration of FIG. 1, the wafer-transport opening 62 is provided at the far side of the plane of the drawing while the depression 62 is provided at the near side. The wafer transport-opening 61 is closed by a gate valve G in the normal state of the thermal processing apparatus. When the gate valve G is opened, the processing vessel 2 communicates with a load lock chamber not illustrated via the wafer-transport opening 61. On the other hand, the depression 62 is provided in correspondence to the wafer-transport opening 61 so as to maintain the symmetry of the processing vessel 2 as much as possible. In the illustrated example, the depression 62 is conveniently provided with an observation window 63.

Figure 6:
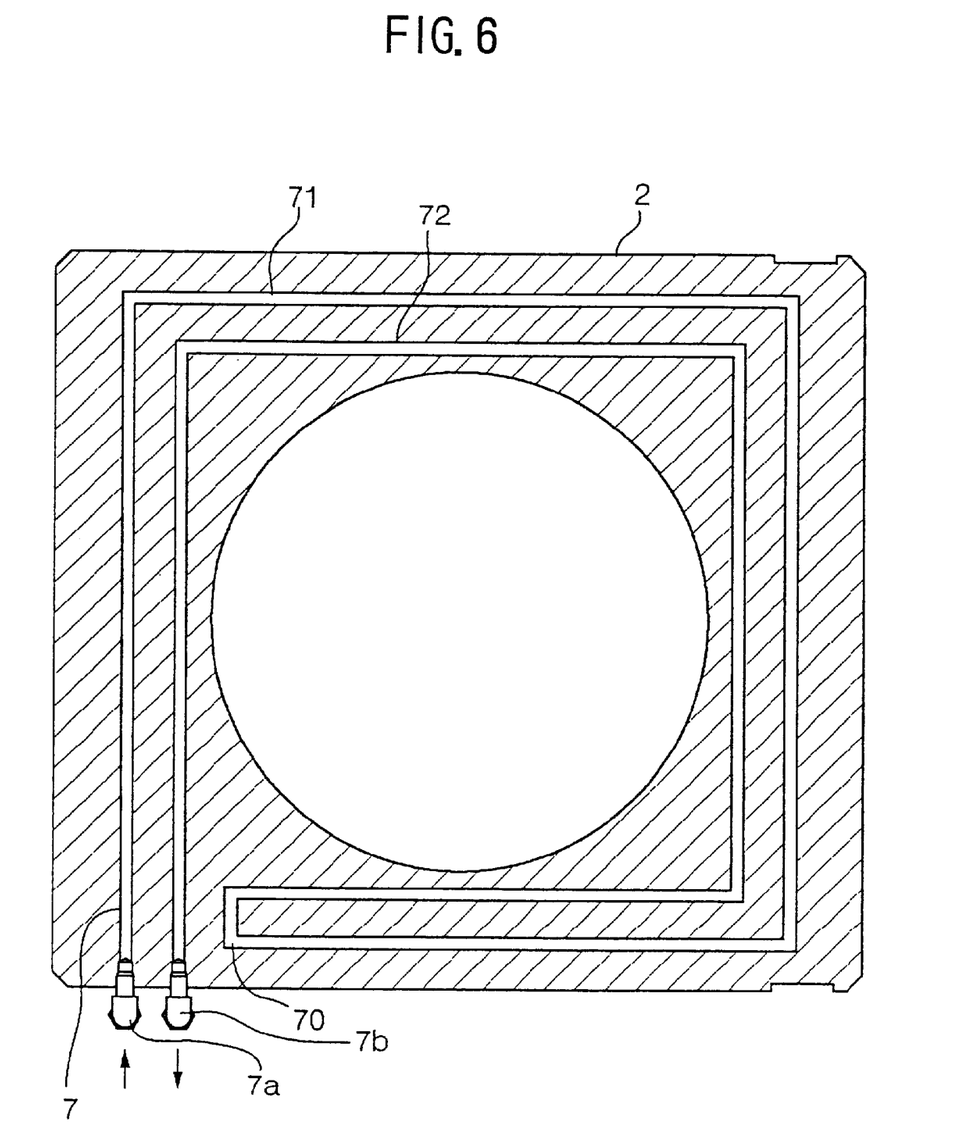
FIG. 6 is a diagram showing the construction of a cooling water passage formed in a processing vessel in the thermal processing apparatus of FIG. 1.

As represented in FIGS. 1, 2 and 6, the circumferential wall of the processing vessel 2 is formed with a cooling water passage 7 immediately below the wafer-transport opening 61, wherein the cooling water passage 7 has an inlet port 7a from which cooling water is introduced. The cooling water passage 7 includes a first part extending from the inlet port 7a along the circumferential wall of the processing vessel 2 for substantially the entire circumferential length thereof to a turn-around point and a second part extending from the turn-around point to an outlet port 7b along the circumferential wall for substantially the entire circumferential length thereof in a direction opposite to the direction of the first part. Thus, the first part and the second part of the cooling water passage 7 extends parallel with each other wherein the second part is located inner side the first part with respect to the wafer W.

Figure 7:
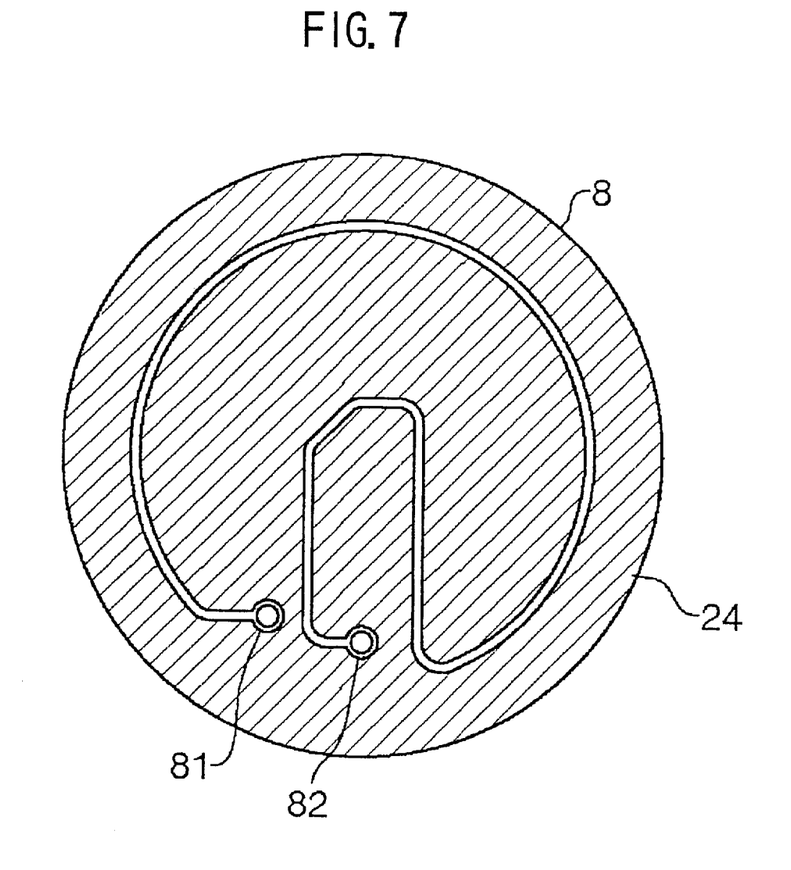
FIG. 7 is a diagram showing the construction of a cooling water passage formed in a bottom plage of the thermal processing apparatus of FIG. 1.

Further, a similar cooling water passage 8 is provided also in the bottom plate 24 as represented in FIG. 7.

Referring to FIG. 7, the cooling water passage 8 is formed in correspondence to the outer rim of the wafer W on the stage 22 and includes an inlet 81 to which the cooling water is supplied. The cooling passage 8 extends over almost the entire circumferential length of the wafer W to be processed, wherein it can be seen that the cooling passage 8 then changes the direction thereof toward the center of the bottom plate 24 and further toward the peripheral part of the bottom plate 24 where the outlet port 82 is provided.

In order to avoid the problem of the temperature pattern of the cooling water passage 8 being transferred to the wafer W on the stage 22, the cooling water passage 8 is provided at a depth of 10–20 mm from the top surface of the bottom plate 24 facing the wafer W. In view of the necessity of maintaining the temperature of the bottom plate 24 below an allowable temperature limit while increasing the depth of the bottom plate 24, which is made of aluminum, the temperature of the cooling water may be controlled depending on the process temperature.

Next, the operation of the thermal processing apparatus of the present embodiment will be described.

First, the gate valve G is opened and the wafer W is introduced into the processing vessel 2 via the wafer-transport opening 61 from a load-lock chamber not illustrated while using a transportation arm also not illustrated. The wafer W thus introduced is placed on the stage 22.

Next, the outer rotary body 33 is rotated, and the stage 22 is rotated in response thereto via the magnetic coupling between the magnets 36 and 37 at a rotational speed of 70 rpm. Further, the temperature of the wafer W is detected real time by the radiation thermometer 25, and the lamp 42 is controlled in response to the output of the radiation thermometer 25 such that the wafer W is raised to a predetermined temperature such as 1000° C. At the same time, an inert gas such as an N2 gas is supplied into the processing chamber 2 as a processing gas via the gas inlet port 51.

With regard to the supply of the processing gas, the gas is first supplied into the buffer chamber 54 for diffusion, and the gas thus diffused in the buffer chamber 54 is then introduced into the laterally elongated gas inlet port 51 via a number of minute holes 53. The processing gas is then supplied to the surface of the wafer W uniformly and is evacuated from the evacuation port 57 disposed opposite to the gas inlet port 51. In one example, the atmosphere in the processing vessel 2 is maintained at an ordinary pressure (atmospheric pressure).

In this state, the wafer W experiences an annealing processing for a predetermined duration, and the lamp 42 is then turned off for lowering the temperature of the wafer W. When the wafer W has reached a predetermined temperature, the rotation of the stage 22 is stopped.

During the foregoing processing, cooling water having a temperature of about 25° C., for example, is introduced into the cooling water passage 7 via the inlet port 7a. The cooling water thus introduced then travels along the first part of the cooling water passage 7 over substantially the entire circumferential length of the processing vessel 2 in a first direction while absorbing heat therefrom and reaches the turn-around point. The cooling water then enters the second part of the cooling water passage 7 and travels in the second, opposite direction to the outlet port 7b while absorbing heat from the circumferential wall of the processing vessel 2. The cooling water thus reached the outlet port 7b may have a temperature of 45° C. Further, a similar cooling is made for the bottom plate 24 by causing to flow cooling water through the cooling water passage 8 formed therein.

According to the foregoing construction of the cooling water passage 7 formed in the thermal processing apparatus, the circumferential temperature distribution caused in the circumferential wall of the processing vessel 2 by the gradual temperature rise of the cooling water from the inlet port 7a to the turn-around point is successfully cancelled out by the circumferential temperature distribution, which is caused in the circumferential wall by the gradual temperature rise of the cooling water from the turn-around point to the outlet port 7b. It should be noted that the second part 72 of the cooling water passage may be provided outside the first cooling water passage 71.

In the event the thermal processing is conducted in the processing vessel 2 at the ordinary pressure, there occurs substantial heat conduction from the circumferential wall to the wafer W via the atmosphere used for the processing. Thus, the process conducted to the wafer W tends to be affected by the temperature distribution in the circumferential wall of the processing vessel 2. By using the cooling water passage 7 of the present embodiment, it becomes possible to achieve a uniform temperature distribution in the wafer W even in such a case the rotational speed of the wafer W is small. Thus, a highly uniform thermal processing can be made on the wafer W by using the thermal processing apparatus of the present embodiment. As noted before, the use of large wafer rotational speed for achieving uniform wafer temperature distribution as used in conventional thermal processing apparatus raises the problem of particle formation.

It should be noted that the construction of the present embodiment for achieving uniform temperature distribution in the circumferential wall of the processing vessel 2 is effective not only in the case of conducting thermal processing at the ordinary pressure but also in a reduced pressure environment, as the circumferential wall produce a uniform distribution in the thermal radiation therefrom to the wafer W.

Due to the fact that the gas supply inlet 51 has a laterally elongated, slit-like form, the processing gas introduced through the minute holes 53 form a laterally elongated, sheet-like flow in which the distribution of the flow velocity is uniform. Thus, the foregoing construction of the gas supply inlet 51 also contributes to the improvement of uniformity in the thermal processing of the wafer W.

In the construction of the present embodiment, it should further be noted that the circumferential wall of the processing vessel 2 is formed with the depression 62 so as to oppose the wafer-transport opening 61, while such a construction realizes a generally symmetric arrangement for the water-transport opening 61, the gas inlet port 51, the depression 62 and the evacuation port 57. More specifically, these elements are formed along the circumferential wall of the processing vessel 2 in the clockwise direction or in the counter clockwise direction with an angle of 90° between one element and the next element.

Because of the near symmetry construction for the circumferential wall of the processing vessel 2, the heat transfer from the circumferential wall to the wafer W, including heat radiation and heat conduction, becomes uniform in the circumferential direction and a uniform temperature distribution is achieved in the wafer W even in the case the rotational speed of the wafer W is reduced.

Summarizing above, the thermal processing apparatus of the present invention realizes a highly uniform temperature distribution in the wafer W.

In the event the height of the gas inlet port 51 has increased 2 mm, there appears a non-uniform velocity distribution in the gas flow due to increased resistance at the lateral edge part as compared with the central part of the sheet-like gas flow. On the other hand, the height of less than 0.5 mm is difficult from the viewpoint of machining. Thus, it is concluded that the preferable height of the gas inlet port 5 would in the range between 0.5 mm and 2 mm.

In the thermal processing apparatus of the present invention, it is also possible to hold the wafer W without causing rotation and rotate the lamp. Further, the heat source is by no means limited to the lamp but a heater embedded in a non-rotating stage may also be used. In this case, the heater heats the rear surface of the wafer W.

It should be noted that the present invention is applicable also to the apparatus for other processes including a CVD process or oxidation process.

Further, the present invention is not limited to the embodiments described heretofore, but various variations and modifications may be made without departing from the scope of the invention.

What is claimed is:

1. A thermal processing apparatus comprising:
    a processing vessel accommodating therein a stage, said stage being adapted for holding a substrate to be processed;
    an evacuation system connected to said processing vessel;
    a heater disposed so as to heat said substrate on said stage;
    a gas inlet port provided on said processing vessel for introducing a gas into said processing vessel; and
    a coolant passage provided in a circumferential wall of said processing vessel, said coolant passage comprising: a first part connected to an inlet port of said coolant and extending along said circumferential wall of said processing vessel to a turn-around point, and a second part connected to said turn-around point and extending along said circumferential wall in a reverse direction to said first part to an outlet port of said coolant.

2. A thermal processing apparatus as claimed in claim 1, wherein said second part of said coolant passage is located inward with respect to said first part.

3. A thermal processing apparatus as claimed in claim 1, wherein said gas inlet port is provided on said circumferential wall of said processing vessel.

4. A thermal processing apparatus as claimed in claim 3, wherein said gas inlet port forms a laterally elongating slit having a height of 0.5–2 mm.

5. A thermal processing apparatus as claimed in claim 4, further comprising a plurality of holes in a gas supply path at an upstream side of said gas inlet port such that said plurality of holes are aligned in said elongating direction of said gas inlet port.

6. A thermal processing apparatus as claimed in claim 1, where in said stage is rotated relative to said heater during an interval of a thermal processing applied to said substrate held on said stage.

7. A thermal processing apparatus as claimed in claim 1, wherein said heater is a lamp.

8. A method for the thermal processing of a substrate comprising:
   placing said substrate on a stage provided in a processing vessel; and
   heating said substrate while supplying a gas in said processing vessel,
   said heating being conducted while causing a coolant to flow through a circumferential wall of said processing vessel first in a first direction from a coolant inlet port to a turn-around point and then in a second, opposite direction from said turn-around point to a coolant outlet port.

9. A thermal processing apparatus, comprising:
   a processing vessel accommodating therein a stage, said stage being adapted for holding a substrate to be processed;
   an evacuation system adapted to evacuate said processing chamber;
   a heater disposed so as to heat said substrate on said stage;
   said processing vessel having an opening and a depression in a circumferential wall thereof such that said opening and said depression oppose each other with respect to a central axis of said processing vessel, said opening being adapted for connection to a gate valve;
   said processing vessel also having a gas inlet port and an evacuation port on said circumferential wall such that said gas inlet port and said evacuation port oppose each other with respect to said central axis of said processing vessel, said evacuation system being connected to said evacuation port,
   said gas inlet port being located at an angular position offset from said opening by 90° with respect to a central axis of said processing chamber;
   wherein said gas inlet port is shaped and configured so as to have a portion forming a laterally elongated slit having a height of 0.5–2 mm.

10. A thermal processing apparatus, comprising:
    a processing vessel accommodating therein a stage, said stage being adapted for holding a substrate to be processed;
    an evacuation system adapted to evacuate said processing chamber;
    a heater disposed so as to heat said substrate on said stage;
    said processing vessel having an opening and a depression in a circumferential wall thereof such that said opening and said depression oppose each other with respect to a central axis of said processing vessel, said opening adapted for connection to a gate valve;
    said processing vessel also having a gas inlet port and an evacuation port on said circumferential wall such that said gas inlet port and said evacuation port oppose each other with respect to said central axis of said processing vessel, said evacuation system being connected to said evacuation port,
    said gas inlet port being located at an angular position offset from said opening by 90° with respect to a central axis of said processing chamber,
    wherein said gas inlet port is shaped and configured so as to have a portion forming a laterally elongated slit having a height of 0.5–2 mm;
    said thermal processing apparatus further comprising a plurality of holes in a gas supply path at an upstream side of said gas inlet port such that said plurality of holes are aligned in the elongated direction of said gas inlet port.

11. A thermal processing apparatus, comprising:
    a processing vessel accommodating therein a stage, said stage being adapted for holding a substrate to be processed;
    an evacuation system adapted to evacuate said processing chamber;
    a heater disposed so as to heat said substrate on said stage;
    said processing vessel having an opening and a depression in a circumferential wall thereof such that said opening and said depression oppose each other with respect to a central axis of said processing vessel, said opening being adapted for connection to a gate valve;
    said processing vessel also having a gas inlet port and an evacuation port on said circumferential wall such that said gas inlet port and said evacuation port oppose each other with respect to said central axis of said processing vessel, said evacuation system being connected to said evacuation port,
    said gas inlet port being located at an angular position offset from said opening by 90° with respect to a central axis of said processing chamber,
    wherein said depression includes an observation window, and said gas inlet port is shaped and configured so as to have a portion forming a laterally elongated slit having a height of 0.5–2 mm.

12. A thermal processing apparatus, comprising:
    a processing vessel accommodating therein a stage, said stage being adapted for holding a substrate to be processed;
    an evacuation system adapted to evacuate said processing chamber;
    a heater disposed so as to heat said substrate on said stage;
    said processing vessel having an opening and a depression in a circumferential wall thereof such that said opening and said depression oppose each other with respect to a central axis of said processing vessel, said opening being connected to a gate valve;
    said processing vessel also having a gas inlet port and an evacuation port on said circumferential wall such that said gas inlet port and said evacuation port oppose with each other with respect to said central axis of said processing vessel, said evacuation system being connected to said evacuation port,
    said gas inlet port being located at an angular position offset from said opening by 90° with respect to a central axis of said processing chamber,
    wherein said depression includes an observation window, and
    said gas inlet port is shaped and configured so as to have a portion forming an elongated slit having a height of 0.5–2 mm;
    said thermal processing apparatus further comprising a plurality of holes in a gas supply path at an upstream side of said gas inlet port such that said plurality of holes are aligned in the elongated direction of said gas inlet port.

13. A thermal processing apparatus, comprising:
    a processing vessel accommodating therein a stage, said stage being adapted for holding a substrate to be processed;

an evacuation system adapted to evacuate said processing chamber;

a heater disposed so as to heat said substrate on said stage;

said processing vessel having an opening and a depression in a circumferential wall thereof such that said opening and said depression oppose each other with respect to a central axis of said processing vessel, said opening being adapted for connection to a gate valve;

said processing vessel also having a gas inlet port and an evacuation port on said circumferential wall such that said gas inlet port and said evacuation port oppose each other with respect to said central axis of said processing vessel, said evacuation system being connected to said evacuation port, said gas inlet port being located at an angular position offset from said opening by 90° with respect to a central axis of said processing chamber, wherein said depression includes an observation window, said gas inlet port is shaped and configured so as to have a portion forming a laterally elongated slit having a height of 0.5–2 mm, said stage is rotated relative to said heater during an interval of a thermal processing applied to said substrate held on said stage; and wherein said heater is a lamp.

14. A thermal processing apparatus, comprising:

a processing vessel accommodating therein a stage, said stage being adapted for holding a substrate to be processed;

an evacuation system adapted to evacuate said processing chamber;

a heater disposed so as to heat said substrate on said stage;

said processing vessel having an opening and a depression in a circumferential wall thereof such that said opening and said depression oppose each other with respect to a central axis of said processing vessel, said opening being adapted for connection to a gate valve;

said processing vessel also having a gas inlet port and an evacuation port on said circumferential wall such that said gas inlet port and said evacuation port oppose each other with respect to said central axis of said processing vessel, said evacuation system being connected to said evacuation port, said gas inlet port being located at an angular position offset from said opening by 90° with respect to a central axis of said processing chamber, said depression including an observation window, said gas inlet port being shaped and configured so as to have a portion forming a laterally elongated slit having a height of 0.5–2 mm, and said thermal processing apparatus further comprising a plurality of holes in a gas supply path at an upstream side of said gas inlet port such that said plurality of holes are aligned in the elongated direction of said gas inlet port;

wherein said stage to rotated relative to said heater during an interval of a thermal processing applied to said substrate held on said stage, and wherein said heater is a lamp.

* * * * *